United States Patent [19]

Ozaki et al.

[11] 4,356,517

[45] Oct. 26, 1982

[54] PCM AUDIO REPRODUCING SYSTEM

[75] Inventors: Minoru Ozaki; Ken Onishi; Kunimaro Tanaka, all of Amagasaki, Japan

[73] Assignee: Mitsubishi Denki Kabushiki Kaisha, Tokyo, Japan

[21] Appl. No.: 72,847

[22] Filed: Sep. 6, 1979

[30] Foreign Application Priority Data

Sep. 21, 1978 [JP] Japan .............................. 53-117221

[51] Int. Cl.$^3$ .......................... G11B 27/02; G11B 5/00
[52] U.S. Cl. ......................................... 360/13; 360/32
[58] Field of Search ....................... 360/13, 32, 40, 61, 360/62

[56] References Cited

U.S. PATENT DOCUMENTS 3,932,886  1/1976  Olms ..................... 360/13
4,174,652  11/1979 Campbell ............... 360/32
4,187,544  2/1980  Larner ................... 360/13

OTHER PUBLICATIONS

"Tape Recorder", M. Abe et al., Nippon Shuppan Hoso Kyokai, 1969, p. 199.
"PCM for High-Quality Sound Signal Distribution: Protection Against Digital Errors", BBC Research Dept., Report #1972/18, May 1972.
"PCM Modulation Recording System", Iwamura et al., Journal of the Audio Eng'r. Soc., Sep. 73, vol. 21, #7, pp. 535–541.

Primary Examiner—Vincent P. Canney
Attorney, Agent, or Firm—Wenderoth, Lind & Ponack

[57] ABSTRACT

Upon reproducing a PCM audio signal, the disclosed weighting circuit gradually changes the weight or value of signal bits constituting the PCM audio signal in accordance with a command signal so as to vary gradually a level of a reproduced analog audio signal corresponding to the PCM audio signal.

7 Claims, 6 Drawing Figures

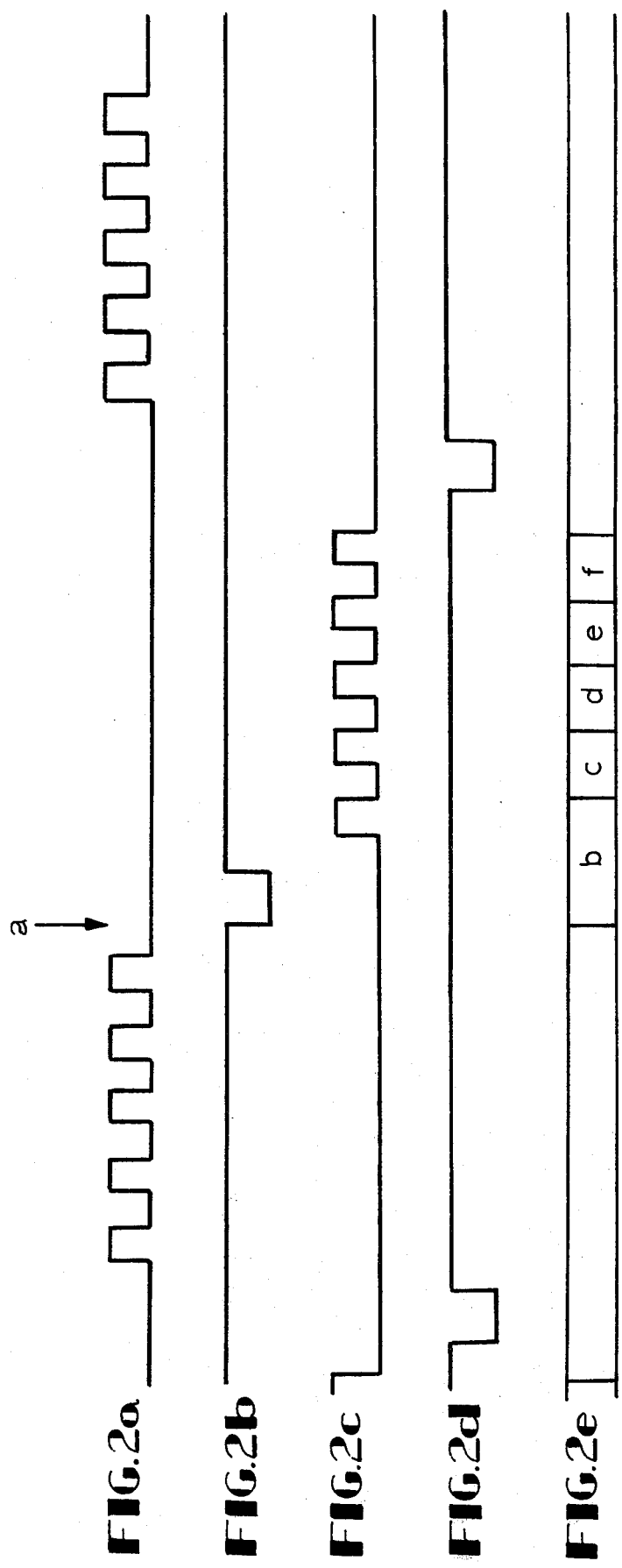

PCM AUDIO REPRODUCING SYSTEM

BACKGROUND OF THE INVENTION

This system relates to a PCM audio reproducing system for reproducing a pulse code modulated audio signal while performing a fade-in or fade-out operation.

In general, PCM audio reproducing systems are characterized in that the audio signal recorded, as a PCM signal, on the particular magnetic tape or the like can be faithfully reproduced without the influence of tape hiss and noise, on the one hand, and have been unable to easily perform the fade-in and fade-out functions employed with analog audio reproducing systems while the PCM signal remains intact, on the other hand. In order to put PCM audio reproducing systems to practical use, however, it is necessary for them to have the fade-in and fade-out function capability while maintaining a high tone quality.

Accordingly, it ia an object of the present invention to provide a new and improved PCM audio reproducing system having the fade-in or fade-out function.

SUMMARY OF THE INVENTION

The present invention provides a PCM audio reproducing the originally recorded audio signal system for reproducing from a record medium having recorded thereon a PCM audio signal produced by subjecting a level of a audio signal to the pulse code modulation, and including weighting means for successively changing the weight of signal bits constituting the PCM audio signal in accordance with a command signal to thereby perform a fade-out or fade-in operation.

Preferably the PCM audio reproducing system may comprise a first shift register for registering a PCM audio signal constituted of a plurality of signal bits; a first gate responsive to a value of binary ONE put at the most significant digit position of the PCM voice signal registered in the first shift register to pass intact therethrough the PCM audio signal, and responsive to a value of binary ZERO put at the most significant digit position of the PCM audio signal to invert the PCM audio signal except for the binary value at the most significant digit position thereof and pass the inverted PCM audio signal therethrough; a second shift register for receiving in a parallel circuit relationship the PCM audio signal passed through the first gate and registering it therein, the PCM audio signal within the second shift register shifting one digit position toward the least significant digit position of the second shift register upon the occurrence of each pulse of a train of clock pulses; a second gate for passing therethrough an output from the second shift register in accordance with the status of a control signal applied thereto; a full adder connected to the output of the second gate; a latching circuit connected to the output of the full adder to temporarily store the output from the full adder; the full adder effecting the full addition of the output from the second gate and the output from the latching circuit; a third gate for receiving in a parallel circuit relationship the output from the latching circuit, the third gate being the same in operation as the first gate; and a third shift register for receiving in a parallel circuit relationship the output from the third gate and also for receiving the binary value put at the most significant digit position of the PCM audio signal registered in the first shift register, the third shift register providing a PCM audio signal enabled to perform the fade-in or fade-out operation.

BRIEF DESCRIPTION OF THE DRAWINGS

The present invention will become more readily apparent from the following detailed description taken in conjunction with the accompanying drawings in which:

FIGS. 2a-2e comprise a timing chart useful in explaining the operation of the arrangement shown in FIG. 1.

DESCRIPTION OF THE PREFERRED EMBODIMENT

Figure 1:
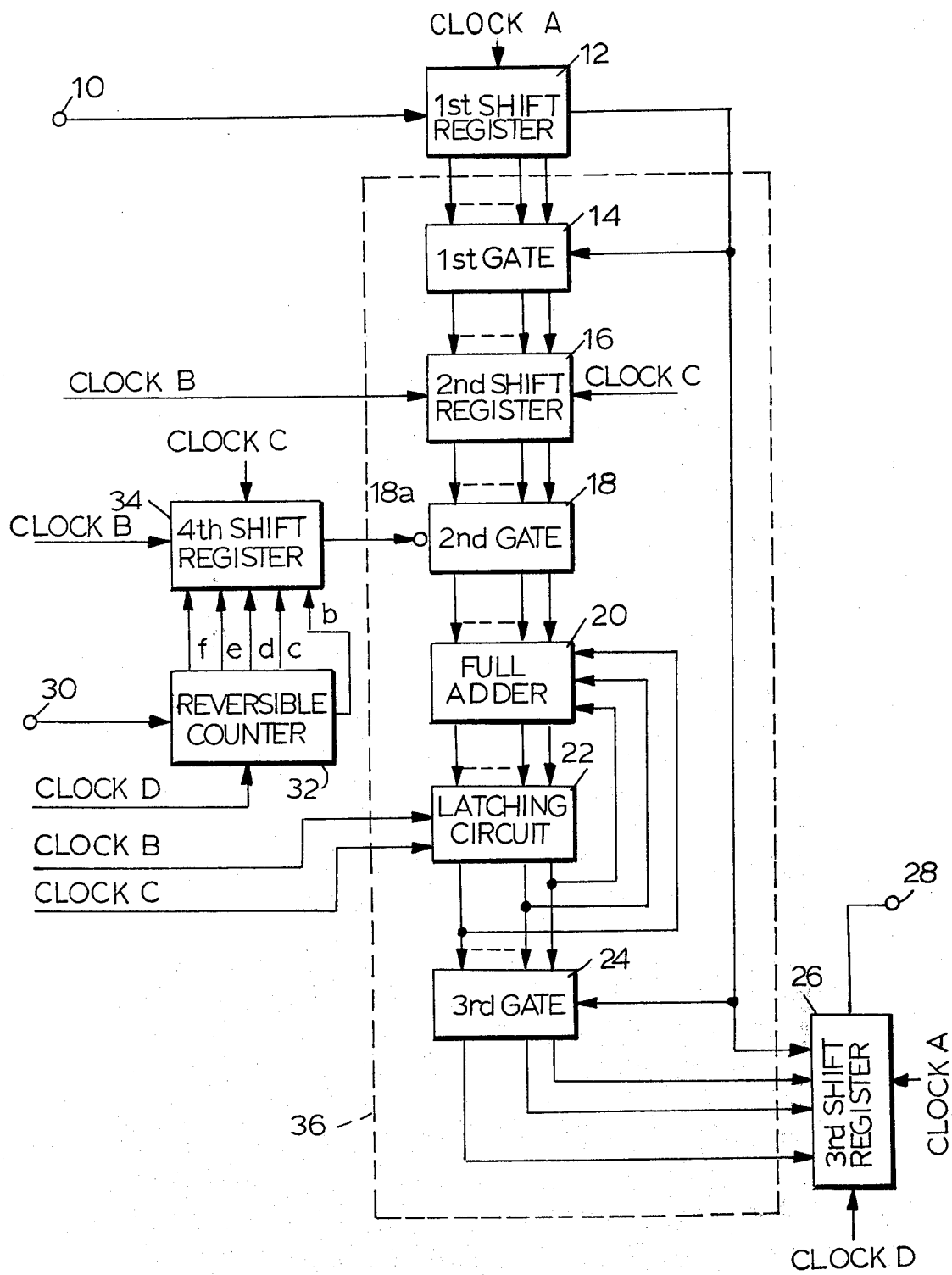
FIG. 1 is a block diagram of one embodiment according to the PCM audio reproducing system of the present invention.

Referring now to FIG. 1 of the drawings, there is illustrated one embodiment according to the PCM audio reproducing system of the present invention. The arrangement illustrated comprises an input terminal 10 and a first shift register 12 connected thereto. By subjecting an audio signal to a PCM system, a PCM audio signal has been produced and recorded on a record medium. The PCM audio signal reproduced from the record medium is applied to the input terminal 10 and includes a plurality of samples, each having a plurality of bits, in this case, five bits. The first shift register 12 forms a series combination with a first gate 14, a second shift register 16, a second gate 18, a full adder 20, a latching circuit 22, a third gate 24 and a third shift register 26 serially interconnected in the named order. In this series combination, each pair of adjacent components are interconnected through a plurality of leads, one lead for each bit included in each sample of the PCM signal. In other words, each component has a plurality of outputs connected in a parallel circuit relationship to mating inputs of the next succeeding component.

The first shift register 12 includes a separate output connected to the first gate 14 and also directly to an input of the third gate 24 and shift register 26. The third shift register 26 is connected to an output terminal 28. The outputs of the latching circuit 22 are fed back in a parallel circuit relationship to the mating inputs of the full adder 20.

In the arrangement, a command input terminal 30 is connected to a reversible counter 32 subsequently connected to a fourth shift register 34 which is, in turn, connected to a control input terminal 18a of the second gate 18. A command signal for initiating the fade-in or fade-out is applied to the command input terminal 30. A weighting circuit according to the present invention is formed of the first gate 14, the second shift register 16, the second gate 18, the full adder 20, the latching circuit 22 and the third gate 24, and is designated by block 36.

The operation of the arrangement shown in FIG. 1 will now be described in conjunction with FIGS. 2a-2e, wherein clock pulses A, B, C and D denoted in FIG. 1 are respectively shown in FIGS. 2a-2d. FIG. 2e illustrates the control signal E applied to the control input terminal 18a of the second shift register 18 for the purpose of illustrating its timing relative to the clock pulses A, B, C and D.

Only for purposes of illustration, it is assumed that the PCM audio signal includes a plurality of samples each formed of five bits as described above. Under the assumed condition, one 5-bit sample of the PCM audio signal applied to the input terminal 10 is responsive to a leading edge or a rise of each clock pulse A (see FIG.

2a) to enter successively the first shift register 12 and shift successively one digit position therein until at time point a (see FIG. 2a) the sample is registered in the shift register 12 in the order starting with the most significant bit.

Under these circumstances, if the most significant bit registered is a binary ONE, then that bit is delivered to the first gate 14 throught the separate lead to open (enable) the gate 14. Therefore, the five bits of the PCM signal registered in the first shift register 12 pass throught the open gate 14 to enter the second shift register 16 in a parallel circuit relationship. When a clock pulse B (see FIG. 2b) applied to the second shift register 16 has a value of binary ZERO, the entered 5-bit PCM signal is set in the second shift register 16.

On the contrary, if the most significant bit registered in the first shift register 12 is a binary ZERO then that bit is similarly delivered to the first gate 14. At the time, the first gate 14, inverts the bits of the PCM signal registered in the first shift register 12 except for the most significant bit. The inverted bits are entered into the second shift register 16 and set therein in response to the clock pulse B of binary ZERO.

From the foregoing it is seen that the first gate 14 forms the absolute value of a reproduced analog signal as listed below in Table I:

TABLE I

| | OUTPUT FROM FIRST GATE 14 | |
|---|---|---|
| Level | Offset Binary | Folded Binary |
| +15 | 11111 | 11111 |
| | 11110 | 11110 |
| | ∘ | • |
| | • | • |
| | ∘ | • |
| | 10001 | 10001 |
| | 10000 | 10000 |
| −1 | 01111 | 00000 |
| −2 | 01110 | 00001 |
| | ∘ | • |
| | • | • |
| | ∘ | ∘ |
| | 00001 | 01110 |
| | 00000 | 01111 |

In Table I, a second column labelled "Offset Binary" denotes analog signals in the form of binary numbers arranged in the order of values and including the most significant bit having a value of binary ONE or ZERO indicating a positive or a negative sign of an associated one of reproduced analog signals. Each of the analog signals has a level expressed by a decimal number with a sign denoted in the leftmost column labelled "Level" and in the same row as each signal. Also the inversion is effected so as to express the absolute value of each of the PCM signals by an associated four bits following the sign bit or the most significant bit. Those absolute values of the PCM signals are denoted in the rightmost column labelled "Folded Binary". As indicated in the rightmost column, a positive PCM signal has the absolute value expressed by the same bits as the positive signal while the absolute value of a negative PCM signal expressed by bits inverted from those expressing the negative signal.

The PCM signal registered in the second shift register 16 is responsive to a trailing edge or a fall of each clock pulse C (see FIG. 2c) to shift one bit position toward the least significant digit position of the shift register 16 while a serial input to the second shift register 14 is always maintained at a value of binary ZERO. This shift of one bit position halves the absolute value of the reproduced analog signal, as illustrated below in Table II.

TABLE II

| | SHIFT BY ONE DIGIT POSITION | | | |
|---|---|---|---|---|
| Divisor | Example 1 | Level | Example 2 | Level |
| X 1 | 11000 | +8 | 01111 | −16 |
| X ½ | 10100 | +4 | 00111 | −8 |
| X ¼ | 10010 | +2 | 00011 | −4 |
| X ⅛ | 10001 | +1 | 00001 | −2 |

As shown by Example 1 in Table II, a positive analog signal in the form of a binary number (11000), having a level of +8 shifts one bit position toward the least significant digit position so that its absolute value changes from a binary number (1000), to a binary number (0100) having a level of +4. That is, the absolute value has been halved, as designated by a fraction of ½ in the leftmost column "DIVISOR". A further shift by one digit position causes the absolute value now registered in the register 16 to be halved. That is, the absolute value first registered in the register 16 is quartered and the resulting analog signal has a level of +2.

This is true in the case of a negative analog signal. As shown by Example 2 in Table II, a negative analog signal expressed by a binary number (01111) has the absolute value halved through a shift by one digit position as described above. In other words, the signal level decreases from −16 to −8. A further shift by one digit position causes the absolute value to be further halved resulting in a level of −4.

In this way the absolute value of the reproduced analog signal is halved each time the clock pulse C changes from a binary ONE to a binary ZERO.

Subsequently, the 5-bit output from the second shift register 16 passes through the second gate 18 under the control of a control signal E applied to the control input terminal 18a of the second gate 18 and then enters the full adder 20. More specifically, if the control signal E has a value of binary ONE, the output from the second shift register 16 can pass intact through the second gate 18. However, if the control signal E has a value of binary ZERO, then the output from the second gate 18 to be equal to a value of binary ZERO.

The output of the second gate 18 enters the full adder 20 and then the latching circuit 22. An output from the latching circuit 22 is partly fed back to the full adder 20 where the full addition of the output from the second gate 18 and the output fed from the latching circuit 22 is effected. The latching circuit 22 is also cleared by a falling edge of a clock pulse B and upon a rising edge of clock pulse C, latching circuit 22 temporarily stores the output from the full adder 20. The full addition effected by the full adder 20 permits the absolute value of a level of an analog signal corresponding to a PCM signal registered in the first shift register 12 to be multiplied by a fraction including a denominator which is a multiple of two (2) and a numerator which is an integer whose value is not equal to one (1). For example, in order to make three eighths the absolute value of a level of such an analog signal, the control signal E can be given value of binary ONE when the content of the second shift register 16 has been equal to one fourth and one eighth the original content respectively thereby to give a value having a weight of ⅜. To this end, values of binary ZERO, ZERO, ONE, ONE and ZERO may be put at bit position b, c, d, e and f of the control signal E (see FIG. 1 and FIG. 2e).

The result of the weighting calculation as described above passes through the third gate 24, identical in operation to the first gate 14, to be converted to a normal PCM signal in the form of a binary number. Bits forming that binary number enter, in a parallel circuit relationship, the third shift register 26 in response to a clock pulse D of binary ZERO (see FIG. 2d). Then, the third shift register 26 is responsive to the rising edge of successive clock pulses A to successively deliver the bits registered therein to the output terminal 28.

From the foregoing it will readily be understood that the weighting circuit 38 gradually changes the weight of signal bits constituting the PCM audio signal applied to the input terminal 10 in accordance with the control signal E supplied to the control input terminal 18a of the second gate 18.

The control signal E includes the digit positions b, c, d, e and f normally having values of binary ONE, ZERO ZERO, ZERO and ZERO. Assuming that the fade-out operation is performed, a command signal for initiating the fade-out is applied to the command input terminal 30 to initiate the reversible counter 32 to count "one" down each time n rises of the clock pulses D occur and an output from the counter 32 is written in the fourth shift register 34 at the fall of the clock pulse B applied to the latter. Thereafter, the output written in the fourth shift register 34 shifts one digit position each time the falling edge of the clock pulse C occurs. This shift causes an output signal from the fourth shift register 34 to be delivered to the control input terminal 18a as a control signal E. When the counter 32 counts down to a binary ZERO, the fade-out operation is completed to stop the counting-down of the counter 32.

The process developed in the reversible counter 32 is clearly shown in the following Table III which describes the relationship between the number of the rising edges of the clock pulse D caused after the initiation of the fade-out and the content of the counter 32.

TABLE III

| RELATIONSHIP BETWEEN NUMBER OF RISING EDGES OF CLOCK PULSE D CAUSED AFTER INITIATION OF FADE-OUT AND CONTENT OF COUNTER 32 | |
| --- | --- |
| Number of Rising edges of clock pulse D after initiation of fade-out | Content of Counter 34 bcdef |
| 0 ~ n − 1 | 10000 |
| n ~ 2n − 1 | 01111 |
| 2n ~ 3n − 1 | 01110 |
| 3n ~ 4n − 1 | 01101 |
| • | |
| • | |
| • | |
| • | |
| 15n ~ 16n − 1 | 00001 |
| 16n ~ | 00000 |

From Table III it can be seen that the reversible counter 32 has its content preset to be of a binary number (10000) until the rising edge of the clock pulse D occurs (n−1) times. Upon the rising edge of the n-th clock pulse D, the counter 32 counts down "one". That is, the content thereof is expressed by a binary number (01000) which is, in turn, held until the (2n−1)th pulse D appears. However, the counter 32 counts down "one" in response to the rising edge of the 2nth clock pulse D. In this way, the counter 32 successively responds to the rising edges of the 3n-th, 4n-th, ... and 15n-th clock pulses D until it is cleared as shown in the lowermost row of Table III.

The fade-in is initiated by applying a command signal for initiating the fade-in to the command input terminal 30. At that time, the reversible counter 32 has its content expressed by a binary number (00000) and counts "one" each time n rising edges of the clock pulse D occur. The count of the counter 32 is written in the fourth shift register 34 at the falling edge of the clock pulse B. The content of the fourth shift register 34 shifts one digit position each time the falling edge of the clock pulse D occurs. As a result of this shift, an output from the shift register 34 is delivered to the control input terminal 8a as a control signal E. When the content of the counter 32 reaches a binary number (10000), the fade-in operation is completed to stop the counting-up of the counter 32.

Therefore it is seen that the fade-out and fade-in time can be suitably determined by setting the value of n properly.

In the fade-out operation, it will be seen that, when the counter 32 has been cleared, the level of the reproduced analog signal is more or less varied in accordance with whether the content of the first shift register 12 has a value of binary ONE or ZERO at the most significant digit position. However, by forcing a binary ONE value at the most significant digit position of the PCM signal entering the third shift register 26 by from the first shift register 12 through the lead which is directly connected to the third shift register 26, the latter can have its content expressed by a binary number (10000) to thereby render the level of the reproduced analog signal equal to zero.

In summary, the present invention provides a PCM audio reproducing system for performing the fade-in or fade-out operation by changing the weight of signal bits constituting a PCM audio signal in accordance with a control signal. Therefore, the present invention is advantageous in that the fade-in or fade-out operation can be performed while the resulting tone quality is held high. Also it is possible to perform the fade-in or fade-out operation during the recording and further upon the mode change. Accordingly, the present invention results in a PCM audio reproducing system having a high performance.

While the present invention has been illustrated and described in conjunction with a single preferred embodiment, it is to be understood that numerous changes and modifications may be resorted to without departing from the spirit and scope of the present invention.

What we claim is:

1. A PCM audio reproducing system for reproducing an original audio signal from a record medium having recorded thereon a digitized PCM audio signal produced by subjecting said original audio signal to the pulse code modulation; said system comprising weighting means for successively changing the weight of digital signal bits comprising said digitized PCM audio signal in accordance with a command signal to thereby perform a fade-out or fade-in operation.

2. A PCM audio reproducing system as claimed in claim 1, wherein said weighting means is operative to change values of the signal bits so as to change a level of an analog signal corresponding to the signal bits.

3. A PCM audio reproducing system as claimed in claim 1, wherein said weighting means include a shift register and wherein said weighting means successively changes the weight of said signal bits by using the shifting operation performed by said shift register.

4. A PCM audio reproducing system as claimed in claim 1, wherein said command signal is a mode changing signal.

5. A PCM audio reproducing system comprising: a shift register for storing a digitized PCM audio signal comprising a plurality of digital signal bits; weighting means for receiving, in a parallel circuit relationship, said PCM audio signal stored in said shift register, said weighting means being responsive to a command signal for initiating a fade-in or fade-out operation to change the values of said signal bits comprising said PCM audio signal so as to successively vary the level of an analog signal corresponding to said PCM audio signal; and another shift register for receiving an output from said weighting means to provide a PCM audio signal and enabled to perform said fade-in or fade-out operation.

6. A PCM audio reproducing system comprising: a first shift register for storing a PCM audio signal comprising a plurality of signal bits; a first gate responsive to a value of binary ONE put at the most significant digit position of said PCM audio signal stored in said first shift register to pass intact therethrough said PCM audio signal, and responsive to a value of binary ZERO put at the most significant digit position of said PCM audio signal to invert said PCM audio signal except for the binary value at the most significant digit position thereof and to pass the inverted PCM voice signal therethrough; a second shift register for receiving said PCM audio signal passed through said first gate and storing it therein, said PCM audio signal within said second shift register shifting one digit position toward the least significant digit position of said second shift register upon the occurrence of each pulse of a train of clock pulses; a second gate for passing therethrough an output from said second shift register in accordance with the status of a control signal applied thereto; a full adder connected to said second gate; a latching circuit connected to said full adder to store temporarily an outut from said full adder, said full adder effecting the full addition of the output from said second gate and the output from said latching circuit; a third gate for receiving, in a parallel circuit relationship, the output from said latching circuit, said third gate being the same in operation as said first gate; and a third shift register for receiving, in a parallel circuit relationship, an output from said third gate and also receiving the binary value put at the most significant digit position of said PCM audio signal stored in said first shift register, said third shift register providing a PCM audio signal and enabled to perform a fade-in or fade-out operation.

7. A PCM audio reproducing system for reproducing an original audio signal from a record medium having recorded thereon a digitized PCM audio signal produced by subjecting said original audio signal to the pulse code modulation; said system comprising weighting means for successively changing the weight of digital signal bits comprising said digitized PCM audio signal in accordance with a command signal to thereby perform a fade-out or fade-in operation;

wherein said control signal is generated by a control generator means including a reversible counter responsive to a command signal for initiating a fade-in or fade-out operation by initiating the counting up or counting down of said reversible counter, and a fourth shift register for receiving, in a parallel circuit relationship, a binary output from said reversible counter and storing it therein, the binary output stored in said fourth shift register shifting one digit position upon the occurrence of each pulse of a train of clock pulses; and wherein said fourth shift register delivers, as said control signal, an output signal to said second gate as a result of the shift by one digit position of said fourth shift register.

* * * * *